（12） United States Patent
Matsumoto et al.

(10) Patent No.: US 6,829,573 B1
(45) Date of Patent: Dec. 7, 2004

(54) METHOD AND SYSTEM TO SEARCH FOR CRITICAL PATH

(75) Inventors: Mitsuo Matsumoto, Tokyo (JP); Gerald Lewis Katz, San Jose, CA (US)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/227,026

(22) Filed: Jan. 7, 1999

(30) Foreign Application Priority Data

Jan. 13, 1998 (JP) .......................................... 10-018093

(51) Int. Cl.[7] .............................. G06F 17/50; G06F 7/00
(52) U.S. Cl. ........................................ 703/20; 713/500
(58) Field of Search ............................. 703/20; 713/500

(56) References Cited

U.S. PATENT DOCUMENTS

| | | | | |
|---|---|---|---|---|
| 5,324,992 A | * | 6/1994 | Maly .......................... | 327/172 |
| 5,553,276 A | * | 9/1996 | Dean .......................... | 713/500 |
| 5,958,077 A | * | 9/1999 | Banerjee et al. ............ | 714/738 |
| 5,991,888 A | * | 11/1999 | Faulkner et al. ............ | 713/501 |

OTHER PUBLICATIONS

Naseer et al.; "Optimal clock period for synthesized data paths"; IEEE 10th Int. Conf. VLSI design; pp. 134–139, Jan. 1997.*
Nahm et al.; "A full digital self–timed clock generation scheme"; IEEE 10th Int. Conf. Microelectronics and VLSI; pp. 319–322, Nov. 1995.*
Chakraborty et al.; "Design for high–speed testability of stuck–at faults"; IEEE 9th Int. Conf. VLSI Design; pp. 53–56, Jan. 1996.*
Katz, "A Case–Study in the use of Scan in microSPARC™ testing and debug", Proceedings International Test Conference, pp. 456–460, 1994.

* cited by examiner

Primary Examiner—Hugh Jones
(74) Attorney, Agent, or Firm—Dellett & Walters

(57) ABSTRACT

This invention discloses a method and system to search for a critical path which allows a quick and reliable search for a critical path by using an actual semiconductor device. When the number of the operating clock pulses between the input of a predetermined data to a semiconductor device and the output of the corresponding data is n pulses, each period of the n pulses is changed from a failing period T1 to a passing period T2 in order to search for a critical path.

10 Claims, 8 Drawing Sheets

FIG. 2A
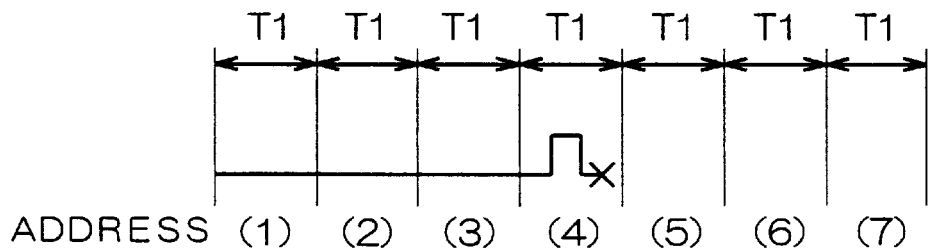
FIG. 2B
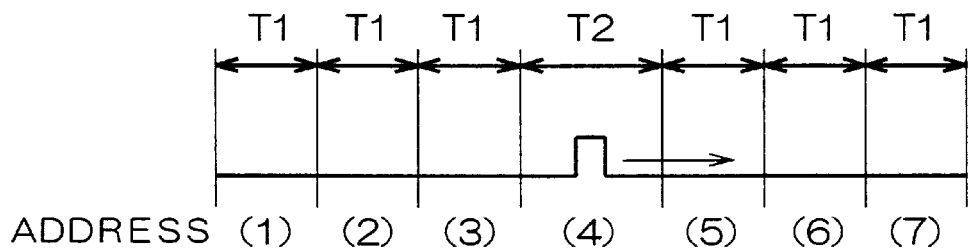
FIG. 3
| ADDRESS | (1) | (2) | (3) | (4) | (5) | (6) | (7) |
|---|---|---|---|---|---|---|---|
| OPERATING PERIOD | t1 | t2 | t3 | t4 | t5 | t6 | t7 |
| INPUT PIN 1 | 0 | 1 | 0 | 1 | 0 | 1 | 0 |
| OUTPUT PIN 1 | × | × | × | × | × | × | LorH |

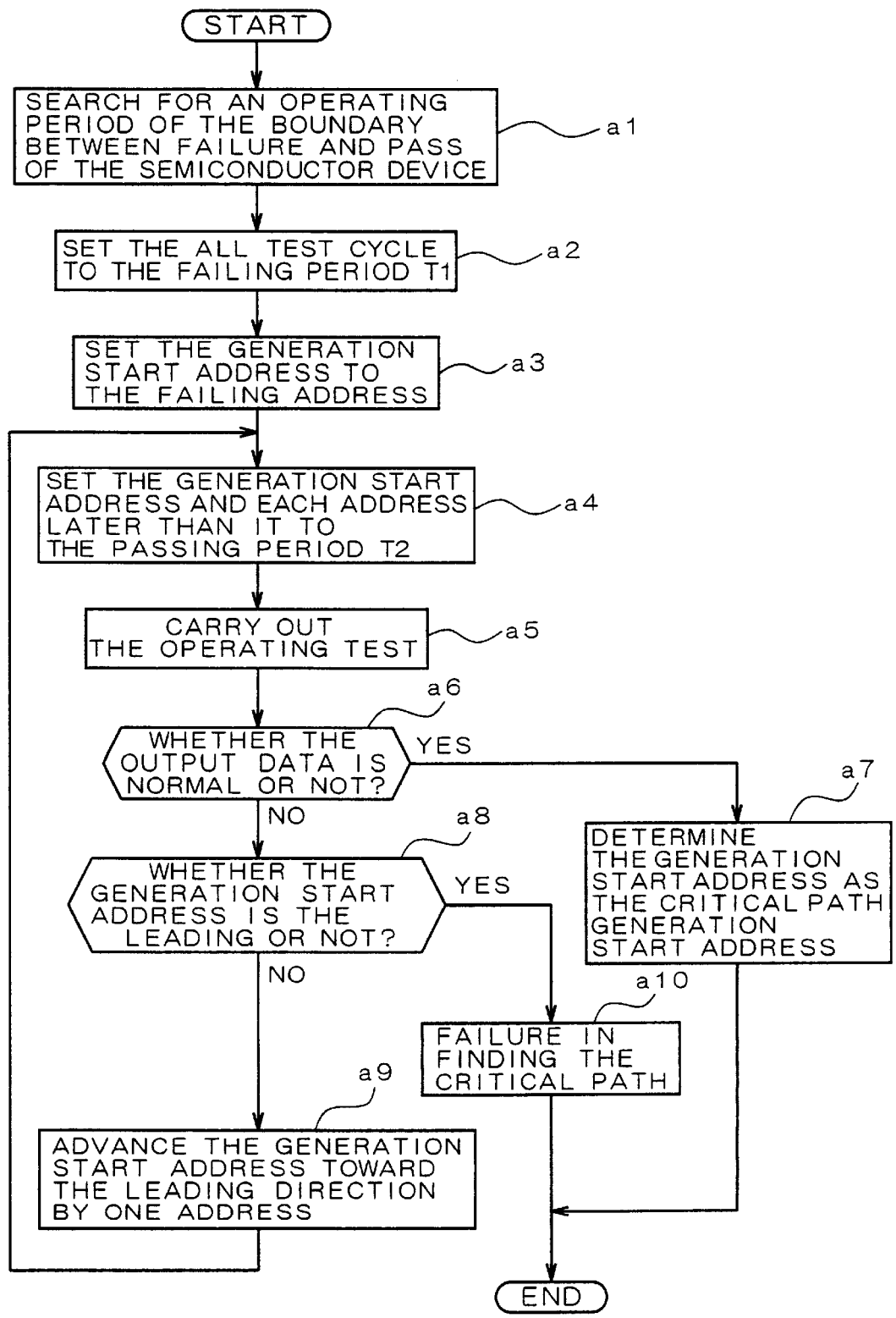

FIG. 5A

| ADDRESS | (1) | (2) | (3) | (4) | (5) | (6) | (7) |
|---|---|---|---|---|---|---|---|
| GENERATION START ADDRESS | | | | | | | ○ |
| OPERATING PERIOD | T1 | T1 | T1 | T1 | T1 | T1 | T2 |

FIG. 5B

| ADDRESS | (1) | (2) | (3) | (4) | (5) | (6) | (7) |
|---|---|---|---|---|---|---|---|
| GENERATION START ADDRESS | | | | | | ○ | |
| OPERATING PERIOD | T1 | T1 | T1 | T1 | T1 | T2 | T2 |

FIG. 5C

| ADDRESS | (1) | (2) | (3) | (4) | (5) | (6) | (7) |
|---|---|---|---|---|---|---|---|
| GENERATION START ADDRESS | | | | | ○ | | |
| OPERATING PERIOD | T1 | T1 | T1 | T1 | T2 | T2 | T2 |

FIG. 5D

| ADDRESS | (1) | (2) | (3) | (4) | (5) | (6) | (7) |
|---|---|---|---|---|---|---|---|
| GENERATION START ADDRESS | | | | ○ | | | |
| OPERATING PERIOD | T1 | T1 | T1 | T2 | T2 | T2 | T2 |

METHOD AND SYSTEM TO SEARCH FOR CRITICAL PATH

BACKGROUND OF THE INVENTION

The present invention relates to a method and system to search for a critical path to identify critical paths in various large scale integrated circuits (LSI). In this specification, a "semiconductor device" means a logic circuit, memory circuit and analog circuit, or a whole semiconductor device composed of any combination thereof.

Today, the number of transistors integrated into LSI's has dramatically increased. Particularly, the circuits of logic LSI's including microprocessors as a typical device, memories, analog LSI's and system LSI's have been becoming increasingly complicated. In order to perform failure analyses on these large scale, complicated and further high speed LSI and to feed-back the results to device design, efforts to search out critical paths in the LSI's have been frequently made. The critical path means particular paths limiting the operating speed of the whole circuit in a signal propagation path in an LSI. For the design of an LSI, it is important to control the propagation time of these paths below predetermined values.

Hitherto, searches for a critical path in an LSI has been performed by using simulations based on the design data of an LSI. For each of circuits constituting an LSI, the simulation technology can calculate from the design data the propagation time to pass through various arithmetic circuits, memories and others from an input of a signal to the output. Therefore, when a predetermined test vector (a test pattern) is inputted, a calculation can obtain how it operates in the inside of the LSI and thus allows a search for a critical path.

On the other hand, the previous technique to obtain a critical path in an LSI by using simulation technology as described above has the following problems.

(1) It takes too much time to make a program which performs a simulation for finding out the critical paths for all logic signals.

(2) Because it does not operate actual circuits (semiconductor devices), it takes too much time to set a load and others that are impossible or difficult for simulations to represent.

(3) Because it performs the processing of massive amount of numerical data, it takes very much time for a search.

SUMMARY OF THE INVENTION

The present invention has been created in view of these problems. The object of the invention is to provide a method and system to search for a critical path which allows a quick and reliable detection of a critical path by using an actual semiconductor device.

A preferred embodiment of the method and system to searching for a critical path in accordance with the present invention is based on the following. The period of operation clock pulses is decreased up to a period T1 on which the device can not operate normally. Then, the operating clock pulse corresponding to the position of a critical path is changed to a little longer period T2, so that the semiconductor device can be normally operated. In consideration of this point, it is examined which pulse of n operating clock pulses between the input of data and the output of the data has been changed from T1 to T2 for normally operating the semiconductor device. Thereby, the search for a critical path is performed.

Specifically, an operating clock producing means sets the periods of the n operating clock pulses to T1 or T2, and an test data input means inputs data to the semiconductor device. The semiconductor device operates corresponding to the inputted data in synchronization with the n operating clock pulses and outputs data. An output data determining means determines whether the output data from the semiconductor device is wrong or correct. When this output data is correct, that is when the semiconductor device normally operates, a search control means decides that a critical path exists at the position of the operating clock pulse with the period T2 and performs search processing for a critical path.

In this way, the present invention performs the search for a critical path by actually operating a semiconductor device. Compared to the case of searching for a critical path by a simulation technique, the search according to the present invention allows fast and reliable detection of a critical path. Further, the search of the present invention can operate a semiconductor device with the setting of a load and others and so allows search processing in consideration of actual operating conditions.

Further, by using the search control means described above, each period of the operation clock pulses from the nth pulse to the (n−i)th pulse and a period of the other are set to T2 and to T1, respectively, and whether the semiconductor device operates normally or not is examined. The value of (n−i) on which the semiconductor device operates normally is identified as a critical path generation start position. This is a first target. Also, by using the search control means, a period of the operation clock pulses included in a predetermined range including the critical path generation start position as the leading position thereof and a period of the other are set to T2 to T1, respectively. Then, whether the semiconductor device operates normally or not is examined. The narrowest range in which the semiconductor device operates normally is identified as a critical path generation segment. This is a second target. In this way, the present invention identifies a critical path generation start position and critical path generation segment and thereby allows an accurate search for a critical path generation position. As a result, it becomes easy to take measures such as a design change.

Yet further, the present invention is suitable for the search for a critical path in a semiconductor device including a PLL circuit which produces another internal clock pulses in synchronization with operating clock pulses inputted from the outside. The search method for critical path in accordance with the present invention also can operate a semiconductor device on a period T1 and T2 of operating clock pulses that are placed in the vicinity of the boundary of whether the semiconductor device operates normally or not. So, when the periods of the operation clock pulses inputted from the outside are changed between T1 and T2, the internal clock pulses produced by the internal PLL circuit are easy to follow the operating clock pulses. Therefore, the search method of the present invention, which searches for a critical path by changing the periods of the operation clock pulses as described above, is readily applicable to such semiconductor device.

BRIEF DESCRIPTION OF THE DRAWINGS

FIGS. 2A–2B illustrate the principle of the search for a critical path utilized in the semiconductor testing system in accordance with an embodiment of the invention;

FIG. 3 illustrates the relation between input and output patterns to a semiconductor device and the period of the operation clock pulses;

FIG. 4 illustrates an operating procedure to searching for a critical path generation start address;

FIGS. 5A–5D illustrate the relation between a generation start address and the operating periods of each address set to ascertain the generation start address;

DESCRIPTION OF THE PREFERED EMBODIMENT

The semiconductor device testing system in accordance with an embodiment of the present invention inputs a predetermined pattern data to a semiconductor device searched for a critical path. At the same time, it operates the semiconductor device by setting the period of the operation clock pulse in each test cycle to a vicinity value on the boundary between a pass (normal operation) and a failure (abnormal operation) to search for a critical path. A feature of the present invention is in such an operation. The details on the semiconductor testing system in accordance with the embodiment of the invention will be explained with reference to the drawings.

Figure 1:
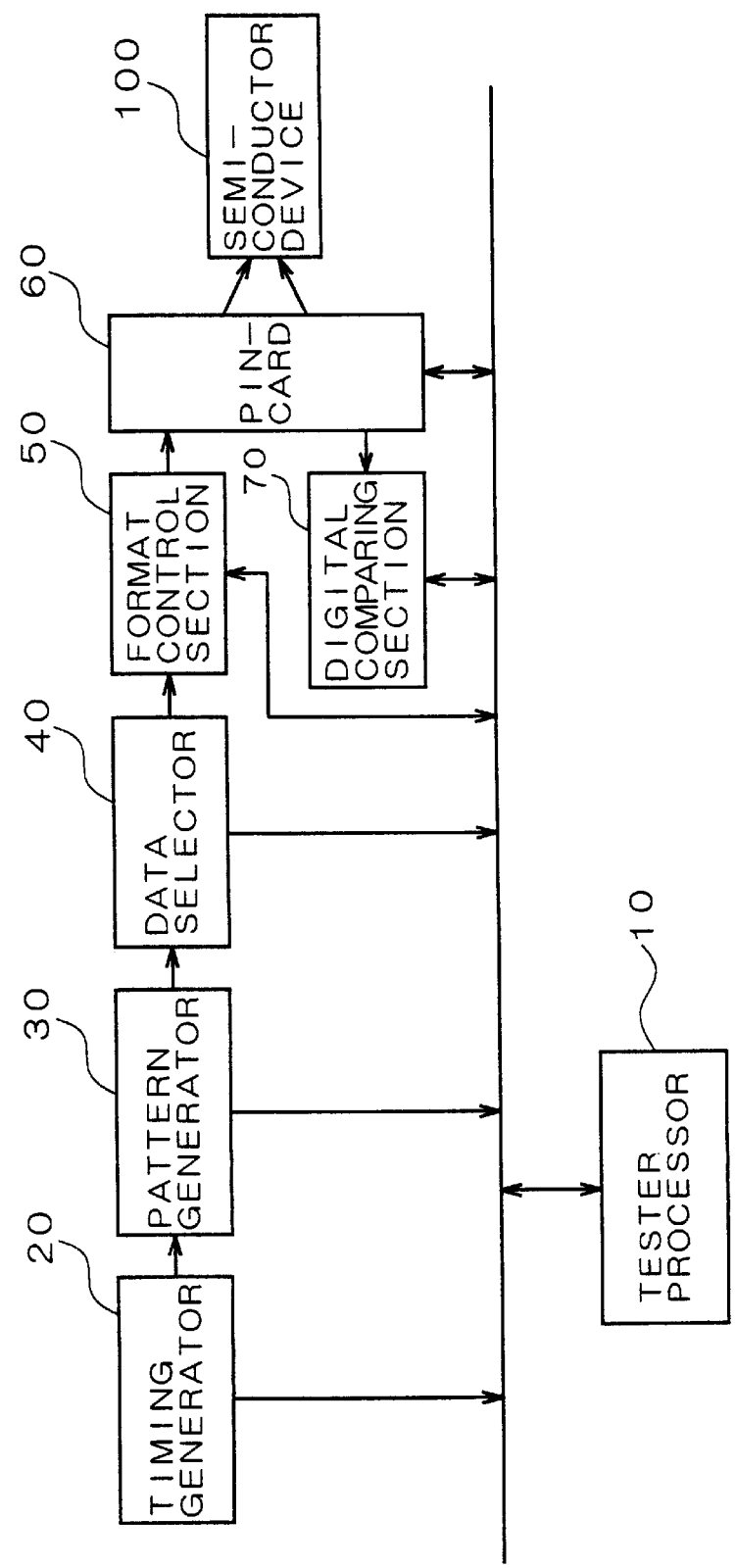
FIG. 1 is a block diagram of the constitution of the semiconductor testing system in accordance with an embodiment of the invention.

FIG. 1 is a block diagram of the semiconductor testing system according to the embodiment. The semiconductor testing system as shown in the FIG. 1 includes the following various sections to input and output various signals necessary for a search operation on a semiconductor device 100 searched for a critical path. That is, it includes a tester processor 10, timing generator 20, pattern generator 30, data selector 40, format control section 50, pin-card 60 and digital comparing section 70.

The tester processor 10 controls the whole operation of the semiconductor testing system for carrying out a predetermined program based on the operating system (OS) and searching for a critical path in a semiconductor device 100. The timing generator 20 sets a basic period required for the search operation and produces various timing edges included within the basic period set. The pattern generator 30 produces pattern data to be inputted to each of the terminals, including a clock terminal, of the semiconductor device 100. The data selector 40 relates the various pattern data outputted from the pattern generator 30 to each corresponding terminal of the semiconductor device 100 which receives the pattern data. The format control section 50 performs waveform control for the semiconductor device 100 based on the pattern data produced by the pattern generator 30 and selected by the data selector 40 and based on the timing edges produced by the timing generator 20.

The pin-card 60 is also intended to provide a physical interface to the semiconductor device 100. For example, the pin-card 60 includes a driver which supplies predetermined pattern waveforms to corresponding terminals of the semiconductor device 100 and a comparator which compares voltage waveforms appearing on each terminal with the predetermined levels of a low level voltage and high level voltage. The digital comparing section 70 compares the data of expected value for each terminal selected by the data selector 40 to the output data of each terminal of the semiconductor device 100.

The timing generator 20 produces clock signals and other timing signals supplied to the semiconductor device 100. The pattern generator 30 produces various data inputted to the semiconductor device 100. Further, the semiconductor device 100 receives the input of predetermined test data and is operated during the test cycles of a predetermined number, and the digital comparing section 70 identifies whether the resulting data outputted from the semiconductor device 100 is normal or not.

The timing generator 20, the pattern generator 30 and data selector 40, the digital comparing sections 70 and the tester processor 10, described above, corresponds to an operating clock pulse producing means, a test data input means, an output data determining means and a search control means, respectively.

The semiconductor testing system in accordance with the embodiment comprises such a configuration as described above. Hereinafter, the detailed operation to searching for a critical path in the semiconductor device 100 using the semiconductor testing system will be explained.

FIGS. 2A and 2B are intended to illustrate the principle of the critical path search which is performed by the semiconductor testing system of the embodiment. Referring to FIGS. 2A and 2B, addresses (1), (2) and so on correspond to the test cycle counts, that is the number of the operating clock pulses inputted. For example, the address (6) shows a position (circuit) which operates in synchronization with the sixth pulse from the input of a test pattern.

As shown in FIG. 2A, by gradually shortening the period of the operation clock pulse, the period causing a failed output pattern is referred to as T1. At this time, if it is possible to pinpoint an address corresponding to the circuit which does not operate normally and so cause the failed output pattern, the improper point is searched out as the point generating a critical path.

For example, FIG. 2A shows a case where an abnormal operation occurs at a position corresponding to the address (4) and the output pattern is failed. In this case, by changing the period of the fourth operation clock pulse corresponding to the address (4) to a period T2 a little longer than T1, a normal operation pattern can be obtained, as shown in FIG. 2B.

In this way, the operating periods of all the test cycles are set to the failing period T1. Then, it is examined which address corresponds to the operating period so increased as to result in a normal operation. Thus, an address generating a critical path can be searched out. The embodiment performs the search processing for a critical path by detecting both a critical path generation start address and a generation segment.

FIG. 3 shows the relation between the input and output patterns to the semiconductor device 100 and the periods of operation clock pulses. For example, it is assumed that, when seven operating clock pulses are inputted from the input of a predetermined test data (in FIG. 3, the data to the address (1) is "0") to an input pin 1 of the semiconductor device 100, an output data corresponding to the test data appears on the output pin 1. Thus, by checking whether the output data at the seventh pulse agrees with the expected value or not, it can be known whether the circuit operation corresponding to the address to be examined is normal or not.

For example, when all the operating periods of the addresses are T1 except for the address (4) with the period T2 as shown in FIG. 2B, each of the operating periods t1–t3 and t5–t7 is set to T1 and the period t4 is exclusively set to T2 as shown in FIG. 3. Only the period of the fourth operation clock pulse is set to T2 in this way, and then the semiconductor device 100 is operated 7 clocks. After the operation, whether the output data appearing on the output pin 1 agrees with the expected value is checked.

Then, the search operation for a critical path will be divided into a search operation for a critical path generation start address and that for a critical path generation segment in the following explanation. For example, as shown in FIG. 3, it is assumed that, at the operations on 7 clock pulses from the input of test data to the input pin 1, the corresponding data is outputted to the output pin 1. Further, critical paths are assumed to exist at the positions corresponding to the addresses (4)–(6) in the following explanation.

FIG. 4 shows an operating procedure of the search for a critical path generation start address. At first, the tester processor 10 varies the periods of operation clock pulses supplied to the semiconductor device 100 so as to search for an operating period of the boundary between the operation of a pass and the operation of a failure (step a1). The variation of the operating periods is performed by sending an instruction to the timing generator 20. The operating periods corresponding to all the addresses are set to certain respective values and the output data on the output pin 1 obtained in synchronization with the seventh clock pulse is examined as shown in FIG. 3. Thus, it is determined whether the semiconductor device 100 operates normally on each operating clock pulse of the varied periods or not. In this way, the period T1 of a operation clock causing a failure and the period T2 of a operation clock resulting in a pass are determined on the boundary described above.

Next, tester processor 10 sends an instruction to the timing generator 20 to set the operating periods of all the addresses to the failing period T1 (step a2). All of the operating periods t1–t7 as shown in FIG. 3 are set to T1.

In this way, all the operating periods are set to the failing period T1. After that, the tester processor 10 sets a critical path generation start address (hereinafter, called simply as "a generation start address") to the address (7) at which the semiconductor device 100 fails (hereinafter, called simply as "a fail address") (step a3). The operating periods of the generation start address and each address later than it are set to the passing T2 (step a4). Then, a predetermined operating test is carried out on the semiconductor device 100 (step a5), and it is determined (step a6) whether the output data appearing on the output pin 1 is normal or not.

FIGS. 5A-5D show the relation between a generation start address and the operating period of each address set to ascertain the generation start address. FIG. 5A shows a case in which the generation start address is set to the address (7) in the step a3 described above. For this case, only the operating period of the nth operation clock pulse corresponding to the address (7) (in the embodiment n=7, so the seventh address) of n operation clock pulses is changed to T2 and the operating test is performed.

As a result of the operating test performed in this way, when the output data appearing on the output pin 1 is normal as expected, the generation start address set at that moment is determined as a critical path generation start address (step a7). The search process for a critical path generation start address is completed.

Further, as a result of the operating test, when the output data appearing on the output pin 1 is not normal, then the tester processor 10 determines whether the generation start address at that moment is the leading address (1) (step a8). At first, because the generating start address has been set to the fail address (7) in the step a3 described above, a negative decision is produced. Then, the tester processor 10 advances the generation start address toward the leading direction by one address to set it to the address (6) (step a9). After that, the processing of the step a4 for setting an operating period and later steps are repeated.

As shown in FIG. 5B, when the generation start address is advanced by one and set to the address (6), the address (6) and later addresses, that is the addresses (6) and (7), are set to the passing period T2. Then, the operating test is carried out.

Further, an operating test is performed with the operating periods of the address (6) and (7) set to the passing period T2. When normal output data does not appear on the output pin 1 even in this test, the generation start address is further advanced to the address (5) as shown in FIG. 5C. Then, the processing of the step a4 for setting an operating period or later steps are repeated.

In these ways, the generation start address is advanced toward the leading side one by one, the operating periods of the generation start address and each of the later addresses are set to the passing period T2 and the operating test is carried out each time. This procedure is repeated until normal output data appears on the output pin 1. For example, as shown in FIG. 5D, the generation start address is set to the address (4) and the operating periods of the addresses (4)–(7) are set to the passing period T2, and then the operating test is performed. When normal output data appears on the output pin 1, the step a6 (to determine whether the output data is normal or not) as described above produces a positive decision, and the generation start address (4) at that time is determined as a critical path generation start address (step a7). The processing of search for a critical path is completed.

However, when normal output data does not appear on the output pin 1 even in the operating test in which the generation start address is set to the leading address (1), the search process is assumed to have failed in finding a critical path and is terminated (step a10).

Figure 6:
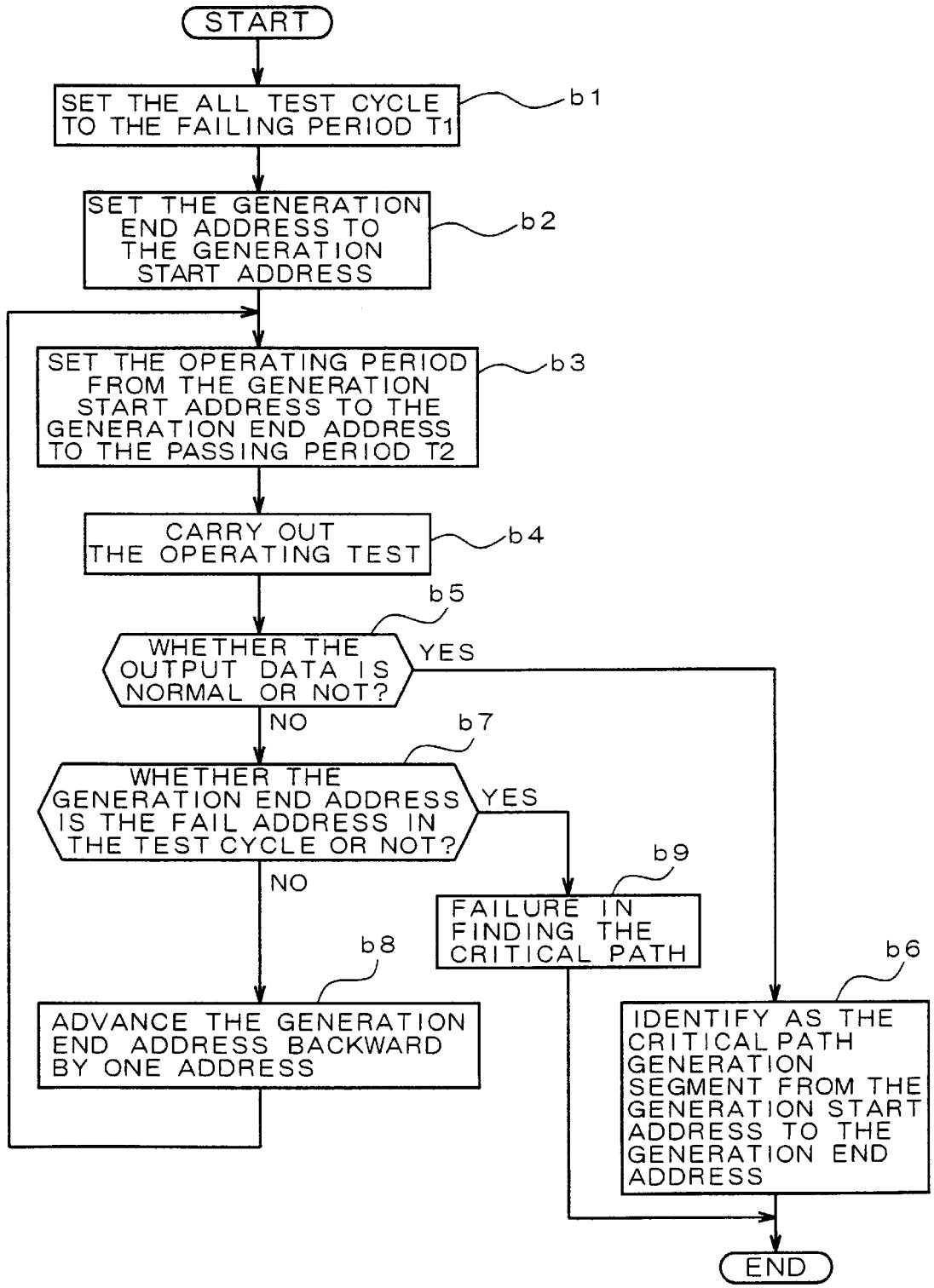
FIG. 6 illustrates an operating procedure for searching a critical path generation segment.

After the identification of a critical path generation start address is finished in this way, the identification of a generation segment will be performed. FIG. 6 shows an operating procedure of the search for a critical path generation segment. At first, the tester processor 10 sends an instruction to the timing generator 20 to set the operating periods of all the addresses to the failing period T1 (step b1). After setting all the operating periods to the failing period T1, the tester processor 10 sets a critical path generation end address (hereinafter, called simply as "a generation end address") to the generation start address identified earlier (step b2). That is, the critical generation segment (hereinafter, called simply as "a generation segment") is limited only to the generation start address and the operating period of the address corresponding to this generation segment is set to the passing period T2 (step b3). And, a predetermined test is carried out on the semiconductor device 100 (step b4) and whether the output data appearing on the output pin 1 is a normal value or not is determined (step b5).

Figure 7A:
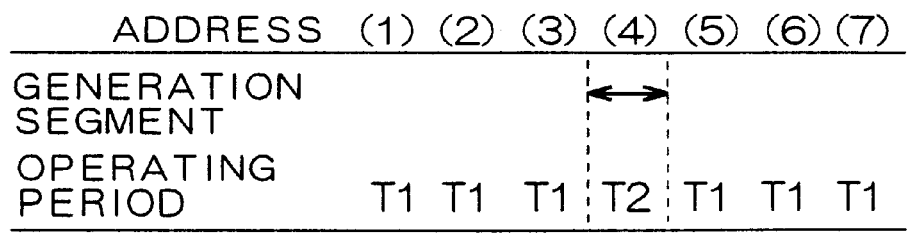
FIGS. 7A–7C illustrate the relation between a generation segment and the operating periods of each address set to ascertain the generation segment.
Figure 7B:
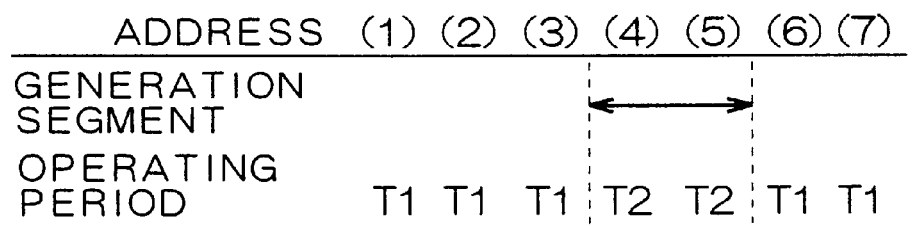
Figure 7C:
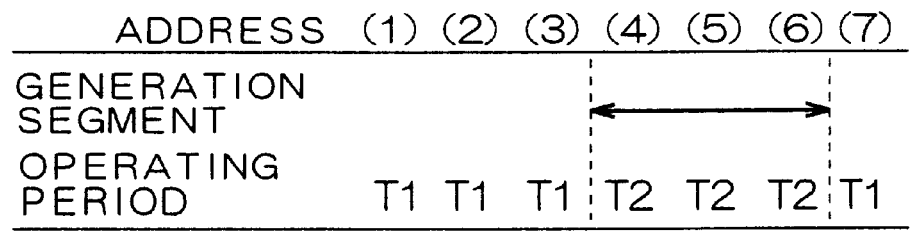

FIGS. 7A–7C each show the relation between a generation segment and the operating period of each address set for ascertaining the generating segment. When the generation end address is set to the generation start address (4) in the step b2 described above, the operating period of the address (4) only as a generation segment is changed to a passing period T2, as shown in FIG. 7A. Then, an operating test is carried out.

As a result of the operating test performed in this way, in the case where the output data appearing on the output pin 1 is normal as expected, the generation segment set at that time is identified as a critical path generation segment (step a6). Then, the processing of the search for a critical pass generation segment is completed.

Further, as a result of the operating test, when the output data appearing on the output pin 1 is not normal, then the tester processor 10 determines whether the generation end address is the fail address (7) in the test cycle (step b7). At first, because only the generation start address (4) is set to the generation end address in the step b2 described above, a negative decision is produced. The tester processor 10 advances the generation end address backward by one address and sets it to the address (5) (step b8) and repeats the processing of the step b3 for setting a operating period described above and the later steps.

As shown in FIG. 7B, when the generation end address is advanced backward by one to the address (5), a segment from the generation start address (4) to the generation end address (5) is set as a generation segment. The operating periods of these two addresses (4), (5) are set to the passing period T2 and the operating test is performed.

When normal output data does not appear on the output pin 1 even in the operating test performed with the operating periods of the addresses (4), (5) set to the passing period T2, the generation end address is further advanced by one to the address (6) as shown in FIG. 7C. Thus, the generation segment includes the addresses (4)–(6) and then the processing of the step b3 described above for setting a operating period and the later steps are repeated.

In this way, the generation end address is advanced backward one by one and the operating period of each address included in the range from the generation start address to the generation end address is set to an passing period T2 and the operating test is carried out each time. This procedure is repeated until normal data appears on the output pin 1. For example, as shown in FIG. 7C, the generation end address is set to the address (6) and each operating period of the addresses from (4) to (6) as a generation segment is set to the passing period T2 and the operating test is carried out. Then, when normal output data appears on the output pin 1, a positive decision is produced in the step b5 (determining whether the output is normal or not) described above. The generation segment at that time is determined as a critical path generation segment (step b6) and the processing of the search for a critical path generation segment is completed.

On the other hand, when normal output data does not appear on the output pin 1 even in the operating test performed with the generation end address set to the fail address (7) in the test cycle, the search processing is assumed to have failed in finding a critical path. Then the search is terminated (step b9). Because, the condition in which the generation end address is set to the fail address (7) in the test cycle replicates the condition shown in FIG. 5D and so normal output data should appear on the output pin 1. Therefore, when normal output data does not appear, there is a possibility of errors in searching for the leading address of a critical path, which has been carried out according to a series of operating procedures shown in FIG. 4.

In the semiconductor testing system in accordance with the embodiment, each operating clock pulse corresponds to each of the addresses from the input of a predetermined test data to the semiconductor 100 until the corresponding output data is outputted. At first, the operating periods of all the addresses are set to a failing period T1 that is on the boundary between a failure and a pass. Then, the operating periods of the addresses in the vicinity of addresses outputting the resulting data to an output pin 1 are changed to a passing period T2 one by one. It is examined which address corresponds to the operating period changed to the passing period T2 before the output data becomes normal data. Thus, by performing both the partial change of the operating periods and the fail/pass identification of the data outputted in response to this change, a critical path generation start address can be searched.

Further, after the detection of a critical path generation start address, the start address is fixed, a generation end address behind the start address is shifted one by one and so the generation segment is extended. Thus, the addresses included in the segment extended before the output data is changed to a normal value are examined. Therefore, by performing the partial change of the operating periods and the fail/pass identification of the data outputted in response to this change, a critical path generation range can be searched. When a critical path generation address and a generation segment are searched out in this way, by checking them against design data and others, the position of sources for failed operation in the semiconductor device 100 can be identified. Thus, it is possible to take measures such as a reduction of propagation delay time in high-speed operation.

In this way, by using the semiconductor testing system in accordance with the embodiment, the search for a critical path is performed based on the operation of the actual semiconductor device 100. In comparison with a search method for a critical path using simulations, the equipment can eliminate a substantial amount of time and effort to make a search program and can reproduce the setting of loads and others in condition close to an actual use of the semiconductor device. Further, because the search for a critical path is performed based on the operation of the actual semiconductor device 100, compared to the case of reproducing each operation of the elements constituting the device by simulations, the equipment can substantially reduce time required for a search.

Figure 8:
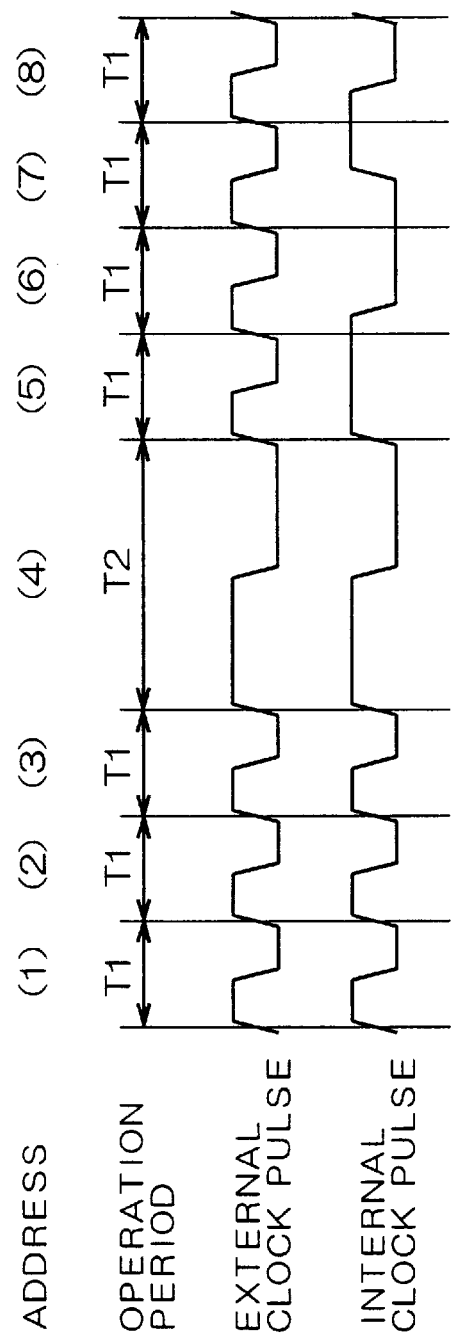
FIG. 8 illustrates the relation between external clock pulses inputted to a semiconductor device including a PLL circuit therein and internal clock pulses.

On the other hand, some of the semiconductor devices 100 searched for a critical path include a PLL Circuit internally. They produce a clock signal (hereinafter, called as an internal clock) with a duty ratio corrected by the internal PLL circuit in synchronization with a clock signal (hereinafter, called as an external clock) inputted from the outside and operate in synchronization with the internal clock produced. Hitherto, for these semiconductor devices 100, a search for a critical path by using an actual semiconductor device 100 has been thought to be impossible. Because, as shown in FIG. 8, a large variation of the external clock significantly disturbs the period of the internal clock produced by the PLL circuit and so a normal operation of the semiconductor device 100 can not be guaranteed.

However, it is also possible that the semiconductor testing system in accordance with the embodiment described above, in the step a1 as shown in FIG. 4, determines the fail/pass boundary and performs the search for a critical path by using a little different operating periods T1 and T2 in close proximity of the boundary obtained. Therefore, when the operating period of each address partially is changed from T1 to T2, the internal clock produced by a PLL circuit in the semiconductor device 100 is little affected. Thus, the search for a critical path can be carried out with the normal operation of the semiconductor device 100 according to a series of the procedures shown in FIG. 4 and FIG. 6.

Figure 9:
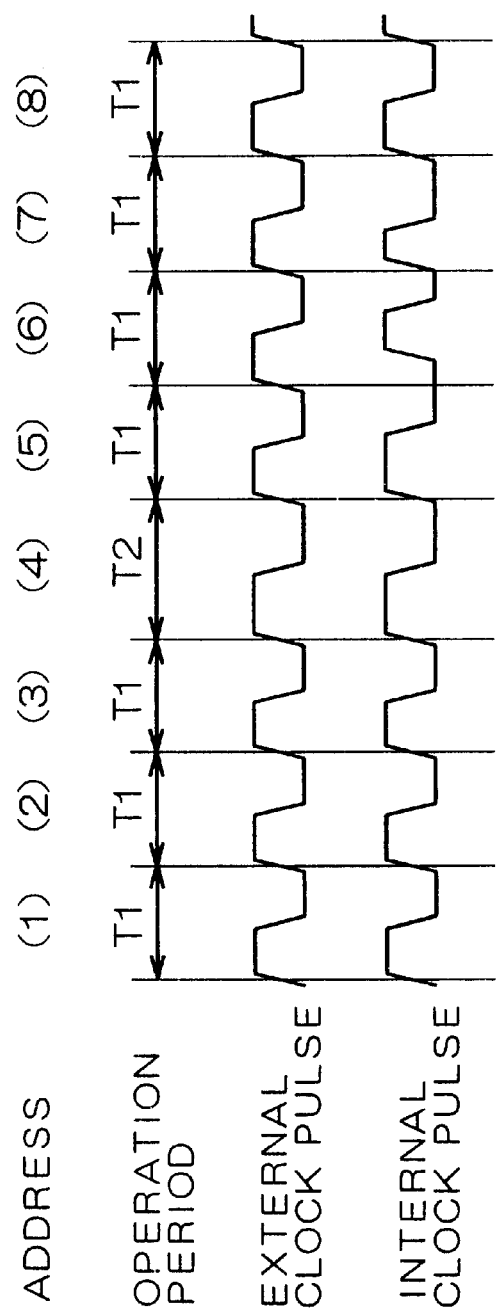
FIG. 9 illustrates the relation between external clock pulses inputted to a semiconductor device including a PLL circuit therein and internal clock pulses.

FIG. 9 shows the relation between the external clock pulses and the internal clock pulses in a case where the periods of the external clock pulses inputted to the semiconductor device 100 is partially changed to the passing operating period T2. For example, by changing the operating period of the address (4) only to T2, the operating period of the internal clock pulse is also changed to T2 by a PLL circuit embedded in the device 100. And, even if the operating period of the external clock pulses is reset to T1 immediately after, the period of the internal clock pulses remains effected over a few addresses and then is convergent to T1.

For example, for the setting of all the operating periods of test cycles to 21 nsec, the output data obtained is not normal, that is in a fail state. For the setting of all the operating period to 22 nsec, the output data obtained is normal, in a pass state. For the setting of an intermediate period of 21.5 nsec, the output data obtained is an unstable state with alternating fail and pass states. In such a case, the failing operating period and the passing operating period are set to 21 nsec and 22 nsec, respectively. Then, because the difference between these periods is 22−21=1 nsec, that is only about 5% of the periods, the internal clock is not significantly subject to the effect of correction by the PLL circuit.

As described above, it is difficult to set accurately only the operating period of an address to be checked to the passing period T2 and the other to the failing period T1 as shown in FIGS. 2A and 2B. However, it is possible to set the operating periods in a predetermined range including a specified address to T2 or a value close to T2. Therefore, according to a series of the procedures shown in FIGS. 4 and 6, even for a semiconductor device 100 with a built-in PLL circuit, it is possible to accurately identify a critical path generation start address and a generation segment. Also, it is possible to search for a critical path in an actual semiconductor device 100 operating.

Now, the invention is not limited in the embodiments described above and various varied implementations are possible in the scope of the substance of the invention. For example, in the embodiment described above, as shown in FIGS. 5A-5D, the search for a critical path generation start address is performed by shifting the generation start address from the rearmost address toward the front address one by one. However, by shifting units of two or more addresses, the output data appearing on the output pin 1 may be also checked (corresponding to a case of i≧2 in the (n−i)).

Further, it is possible to use the binary search method. At first, all the operating periods of the addresses in the rear half are changed to the passing period T2 and the output data at this time is examined so as to determine whether a generation start address exists in the front half or in the rear half. Then, the range including the generation start address is divided into two portions, the operating periods of the addresses within the rear half portion are set to the passing period T2 and the output data is checked. In this way, a segment including a generation start address is gradually made narrower so that one address can be eventually identified. In cases where the semiconductor device 100 has a large-scale circuit and further a critical path generation address is far away from the fail address, it takes too much time to examine each address one by one from the end address in the test cycle. However, use of this method said above can reduce time required for the search.

Also, in the embodiments described above, a search for a critical path is carried out by using semiconductor testing system performing various function tests on the semiconductor device 100. However, as far as it is possible to arbitrarily set the period of clock pulses, the use of general-purpose semiconductor testing system is not necessary and other hardware may be used to realize an alternate.

Further, in the embodiments described above, the tester processor 10 carries out the operating procedures shown in FIG. 4 and FIG. 6 so as to identify a critical path generation start address and a generation segment. However, a series of the procedures performed by the tester processor 10 may be realized by using logic circuits and others, and thereby all the processing necessary for a search for a critical path may be realized only by hardware.

Still further, in the embodiments described above, on the identification of a critical path generation segment, a generation start address and a generation end address within the generation segment are identified one by one. However, critical paths may occur in two or more positions separated and so it is possible to individually search for critical paths on these plural positions. For example, it is assumed that a critical path generation segment has been identified according to the procedures as shown in FIG. 6. In the case of FIG. 7C, a critical path generation segment exists in the addresses (4)–(6). Then, it is assumed that the two addresses (4), (6) really generate critical paths but the address (5) does not generate. In this case, an adverse application of the algorithm of FIG. 6 can be performed. The passing period T2 of the address segment included in the critical pass generation segment are replaced to the failing period T1. And then, by determining whether the output data of the semiconductor device is normal or not, it is possible to search out addresses having no connection to the occurrence of a critical path. Thereby, as a result, it is possible to identify a critical path generation segment caused by plural positions.

What is claimed is:

1. A method of searching for a critical path, comprising:
a first step of detecting a period T1 of a clock pulse signal on which a semiconductor device does not operate normally and a period T2 of said clock pulse signal on which said semiconductor device operates normally, wherein said period T1 and said period T2 are on a boundary of whether said semiconductor device operates normally or not,
a second step of determining whether said semiconductor device operates normally or not when the period of a first part of n pulses of operation clock pulses is set to said T2 and the period of a second part of the n pulses is set to said T1, wherein the number of said operating clock pulses from the input of a predetermined data to said semiconductor device until the corresponding data is outputted is said n.

2. The method of searching for a critical path set forth in claim 1 wherein said second step includes a third step for identifying a critical path generation start position and a fourth step for identifying a critical path generation segment.

3. The method of searching for a critical path set forth in claim 2, wherein in the third step each period from the (n−i)th pulse to the nth pulse of said operating clock pulses and each period of the pulses other than the (n−i)th pulse to the nth pulse are set to said T2 and T1, respectively, whether the operation of said semiconductor device is normal or not is examined, and the largest value of (n−i) on which said semiconductor device operates normally is identified as said critical path generation position.

4. The method of searching for a critical path set forth in claim 2, wherein in the fourth step, a period of said operation clock pulses included in a predetermined range including said critical path generation start position as the leading position thereof are set to said T2 and a period of the clock pulses other than those in the predetermined range are set to said T1, whether the operation of said semiconductor device is normal or not is examined, and the narrowest range of said predetermined range is identified as a critical path generation segment.

5. A system for searching for a critical path, comprising:
- an operating clock pulse producing means for producing operating clock pulses with a period T1 on which said semiconductor device does not operate normally and for producing operating clock pulses with a period T2 on which said semiconductor device operates normally, respectively, wherein the number of said operating clock pulses from the input of a predetermined data to said semiconductor device until the corresponding data is outputted is n, and said period T1 and said period T2 are on the boundary of whether said semiconductor device operates normally or not,
- a test data input means for inputting predetermined data to said semiconductor device for examining whether the operation of said semiconductor device is normal or not,
- an output data determining means for determining, when data is outputted from said semiconductor device correspondingly to the predetermined data inputted by said test data input means, whether the output data matches expected data or not,
- a search control means for examining whether a critical path corresponding to the position of the operating clock pulse with the period T2 exists or not in response to the result of determination of said output data determining means on the data outputted from said semiconductor device in synchronization with the nth pulse of the operating clock pulses, wherein a period of the operation clock pulses of predetermined positions among said n of the operating clock pulses inputted from said operating clock pulse producing means to said semiconductor device is set to said T2, a period of other operating clock pulses within those operating clock pulses not set to said T2 is set to said T1, and thereby said semiconductor device is operated.

6. The system for searching for a critical path set forth in claim 5, wherein said search control means sets each period of said operating clock pulses from the nth of said operating clock pulses to the (n−i)th of said operating clock pulses to said T2 and a period of other of said operating clock pulses to said T1, examines whether said semiconductor device operates normally or not, and identifies the largest number of (n−i) on which said semiconductor device operates normally as a critical path generation start position.

7. The system for searching for a critical path set forth in claim 6, wherein said search control means gradually increases the value of i on changing each period of said operating clock pulses from the (n−i)th pulse to the nth pulse to said T2 and examines whether said semiconductor device operates normally or not.

8. The system for searching for a critical path set forth in claim 6, wherein said search control means sets a period of said operating clock pulses included in a predetermined range including said critical path generation start position as the leading position thereof to said T2, and a period of others of said operating clock pulses not included in the predetermined range to said T1, examines whether said semiconductor device operates normally or not, and identifies the narrowest range of said predetermined range as a critical path generation segment.

9. The system for searching for a critical path set forth in claim 8, wherein said search control means gradually increases said predetermined range on changing a period of part of said operating clock pulses to said T2 and examining whether said semiconductor device operates normally or not.

10. The system for searching for a critical path set forth in claim 5, wherein said semiconductor device includes a PLL circuit producing an internal clock pulse in synchronization with another operating clock inputted from the outside.

* * * * *